(12) United States Patent
Wei et al.

(10) Patent No.: US 8,652,889 B2
(45) Date of Patent: Feb. 18, 2014

(54) FIN-TRANSISTOR FORMED ON A PATTERNED STI REGION BY LATE FIN ETCH

(75) Inventors: Andy Wei, Dresden (DE); Peter Baars, Dresden (DE); Richard Carter, Dresden (DE); Frank Ludwig, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 122 days.

(21) Appl. No.: 13/372,837

(22) Filed: Feb. 14, 2012

(65) Prior Publication Data

US 2012/0211808 A1    Aug. 23, 2012

(30) Foreign Application Priority Data

Feb. 22, 2011    (DE) .................... 10 2011 004 506

(51) Int. Cl.
  *H01L 21/84*    (2006.01)
  *H01L 27/12*    (2006.01)
  *H01L 29/66*    (2006.01)
(52) U.S. Cl.
  USPC ............ 438/157; 257/E29.264; 257/E21.421; 257/347; 257/365
(58) Field of Classification Search
  None
  See application file for complete search history.

(56) References Cited

U.S. PATENT DOCUMENTS

| | | | |
|---|---|---|---|
| 2009/0101977 A1* | 4/2009 | Iwamatsu et al. | 257/347 |
| 2009/0321836 A1* | 12/2009 | Wei et al. | 257/365 |
| 2010/0133615 A1* | 6/2010 | Mulfinger et al. | 257/347 |
| 2011/0198696 A1* | 8/2011 | Choi et al. | 257/347 |
| 2011/0248348 A1* | 10/2011 | Gan et al. | 257/369 |
| 2011/0291196 A1* | 12/2011 | Wei et al. | 257/365 |
| 2012/0001266 A1* | 1/2012 | Lim et al. | 257/369 |
| 2012/0115284 A1* | 5/2012 | Chien et al. | 438/157 |
| 2012/0319192 A1* | 12/2012 | Lim et al. | 257/329 |

OTHER PUBLICATIONS

Translation of Official Communication from German Patent Application No. 10 2011 004 506.6 dated Jan. 9, 2012.

* cited by examiner

*Primary Examiner* — Julio J Maldonado
*Assistant Examiner* — Harpreet Singh
(74) *Attorney, Agent, or Firm* — Amerson Law Firm, PLLC

(57) ABSTRACT

When forming sophisticated semiconductor devices, three-dimensional transistors in combination with planar transistors may be formed on the basis of a replacement gate approach and self-aligned contact elements by forming the semiconductor fins in an early manufacturing stage, i.e., upon forming shallow trench isolations, wherein the final electrically effective height of the semiconductor fins may be adjusted after the provision of self-aligned contact elements and during the replacement gate approach.

17 Claims, 7 Drawing Sheets

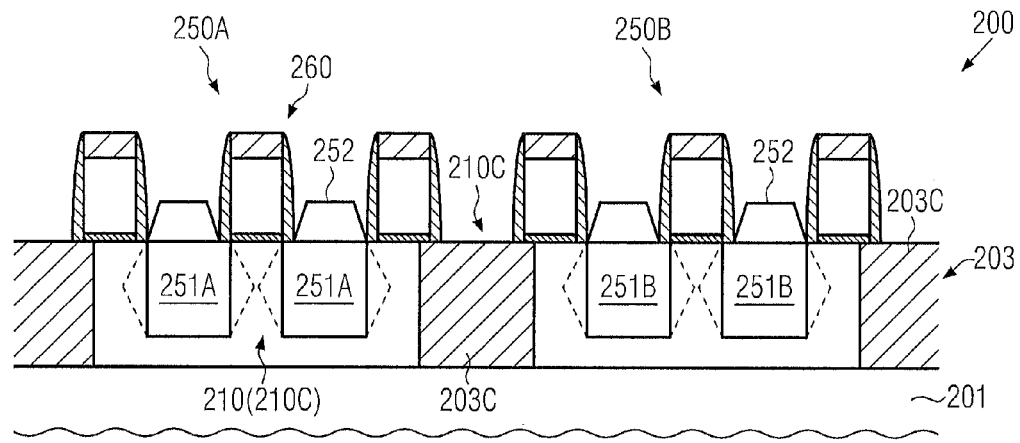
FIG. 2e
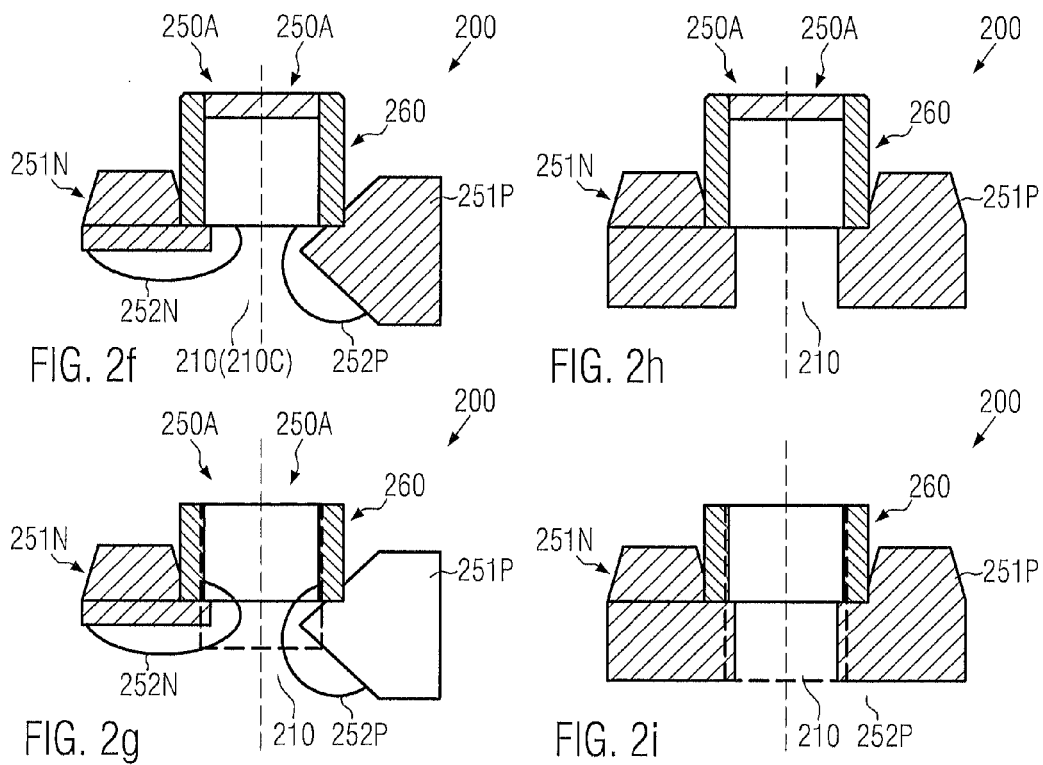
FIG. 2f  FIG. 2h
FIG. 2g  FIG. 2i

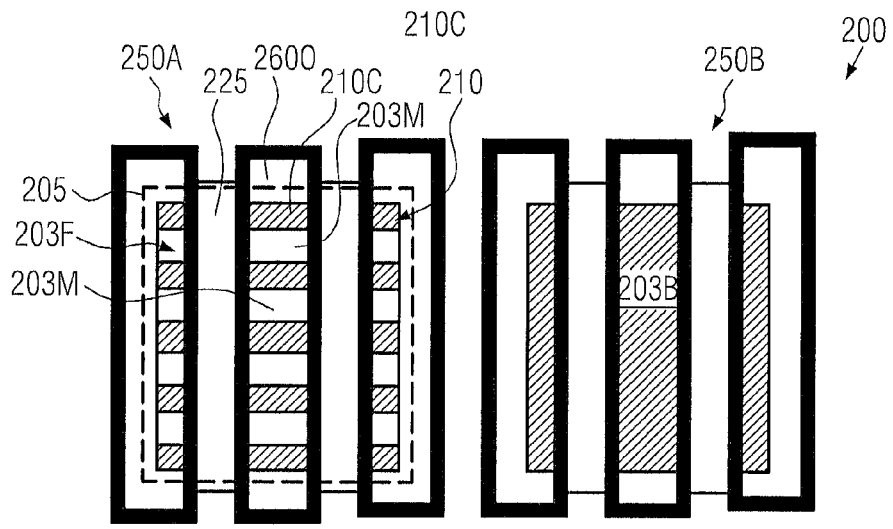
FIG. 2l
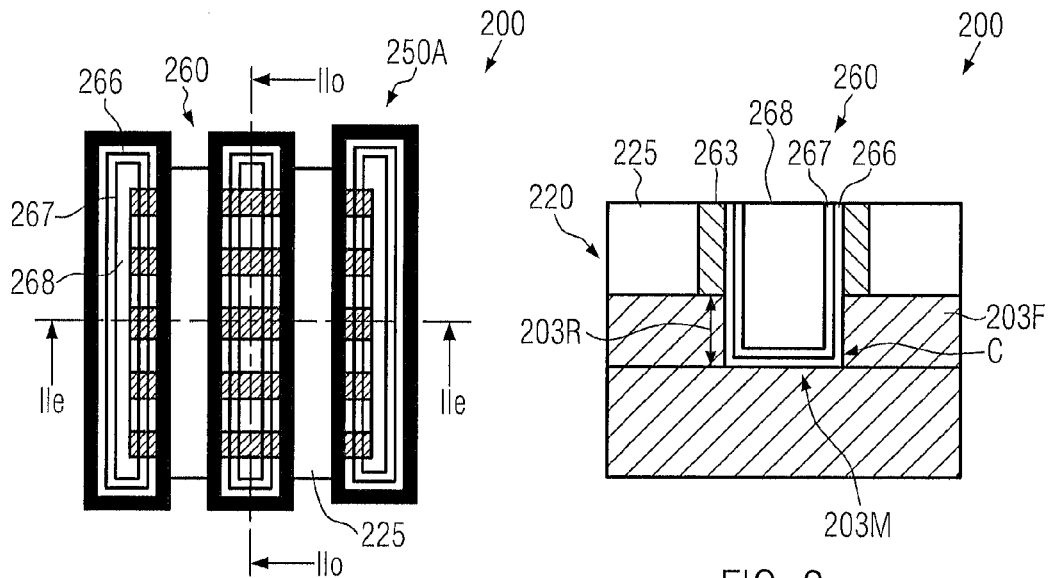
FIG. 2m
FIG. 2n

FIN-TRANSISTOR FORMED ON A PATTERNED STI REGION BY LATE FIN ETCH

BACKGROUND OF THE INVENTION

1. Field of the Invention

Generally, the present disclosure relates to highly sophisticated integrated circuits including transistor elements having a double gate or triple gate architecture (FinFET).

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage, and thus reduced threshold voltage, may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. The relatively high leakage current caused by direct tunneling of charge carriers through an ultra-thin silicon dioxide gate insulation layer may reach values for an oxide thickness in the range of 1-2 nm that may not be compatible with requirements for performance driven circuits.

For this reason, superior gate electrode structures have been developed in which new gate dielectric materials may be implemented, possibly in combination with additional electrode materials, in order to provide superior capacitive coupling between the gate electrode and the channel region, while at the same time maintaining the resulting leakage currents at a low level. To this end, so-called high-k dielectric materials are used, which are to be understood as dielectric materials having a dielectric constant of 10.0 and higher. For example, a plurality of metal oxides or silicates may be used, possibly in combination with conventional very thin dielectric materials, in order to obtain sophisticated high-k metal gate electrode structures. For example, in some well-established approaches, the gate electrode structures of planar transistors may be formed on the basis of well-established concepts, i.e., using conventional gate dielectrics and polysilicon material, wherein the sophisticated material systems are then incorporated in a very late manufacturing stage, i.e., prior to forming any metallization systems and after completing the basic transistor configuration by replacing the polysilicon material with the high-k dielectric material and appropriate gate electrode materials. Consequently, in any such replacement gate approaches, well-established process techniques and materials may be used for forming the basic transistor configurations, while, in a late manufacturing stage, i.e., after performing any high temperature processes, the sophisticated gate materials may be incorporated.

In view of further device scaling, possibly based on well-established materials, new transistor configurations have been proposed in which a "three dimensional" architecture is provided in an attempt to obtain a desired channel width, while at the same time superior controllability of the current flow through the channel region is preserved. To this end, so-called FinFETs have been proposed in which a thin sliver or fin of silicon is formed in a thin active layer of a silicon-on-insulator (SOI) substrate, wherein on both sidewalls and, if desired, on a top surface, a gate dielectric material and a gate electrode material are provided, thereby realizing a multiple gate transistor whose channel region may be fully depleted. Typically, in sophisticated applications, the width of the silicon fins is on the order of magnitude of 10-25 nm and the height thereof is on the order of magnitude of 30-40 nm. In some conventional approaches for forming FinFETs, the fins are formed as elongated device features, followed by the deposition of the gate electrode materials, possibly in combination with any spacers, and thereafter the end portions of the fins may be "merged" by epitaxially growing a silicon material, which may result in complex manufacturing processes, thereby also possibly increasing the overall external resistance of the resulting drain and source regions.

With reference to FIG. 1, a typical conventional SOI-based FinFET will now be described in order to explain the above-referenced problems in more detail. FIG. 1 schematically illustrates a perspective view of a semiconductor device 100 comprising a substrate 101, for example a silicon substrate, having formed thereon a buried insulating layer 102, whereas an initial silicon region or layer is already patterned into a plurality of silicon fins 110, which may thus represent a part of a FinFET transistor. The fins 110 may have a width 110W and a height 110H, as is specified above, in order to comply with packing density and transistor characteristics, such as full depletion and the like. Moreover, a gate electrode structure 160 is illustrated to be formed above and between the semiconductor fins 110. The gate electrode structure 160 may have any appropriate configuration, for instance in terms of a gate dielectric material, an electrode material and the like. Moreover, a spacer structure 161 is typically provided on sidewalls of the gate electrode structure 160. Thus, as discussed above, upon forming a gate electrode structure 160 above the patterned semiconductor fins 110, sophisticated patterning strategies have to be applied since it is typically necessary to etch a very straight profile while removing the polysilicon material or generally the electrode material from the top surface of the semiconductor fins 110. Moreover, the electrode material also has to be reliably removed at the bottom of the semiconductor fins, while also any electrode "spacers" have to be removed, which are temporarily formed due to the anisotropic nature of the corresponding gate etch process. Furthermore, since this highly complex "three-dimensional" etch process may have to be specifically adapted to FinFETs, it is typically not possible to use the same etch process for a planar field effect transistor, thereby requiring a redesign of any existing circuitry so as to avoid any two-dimensional transistors.

As already discussed above, the external resistance, indicated as R, may require an appropriate contact regime in order to provide a combined drain and source area of the semiconductor fin, which is conventionally accomplished by performing a selective epitaxial growth process in order to merge the corresponding end portions of the individual semiconductor fins 110. In this manner, metal silicide regions may be formed in the merged drain and source areas. On the other hand, however, upon merging the corresponding end portions, a parasitic capacitor is formed between the gate and the corresponding source/drain regions, as indicated by C, since here a gate-channel capacitance is not present. In this case, the resulting capacitance of the parasitic capacitor may reach significant values, thereby substantially affecting the overall transistor characteristics.

For these reasons, great efforts have been made in order to provide FinFETs on the basis of a self-aligned process strategy in which the semiconductor fins may be formed so as to be self-aligned with respect to a gate electrode structure. To this end, in a further step, the gate opening is patterned by complex lithography techniques so as to obtain a further mask, which may then define the lateral position and size of the semiconductor fins, which are subsequently formed on the basis of a complex patterning strategy. Thereafter, an appropriate dielectric material, such as silicon dioxide, is filled into the resulting structure in order to appropriately adjust the electrical effective height of the previously etched fins. Although at least some of the problems identified above regarding the conventional SOI-based FinFETs may be solved on the basis of these approaches, it appears that, upon further device scaling and in particular with the introduction of sophisticated gate electrode structures, the patterning sequence described above may no longer be compatible with any such further requirements.

For example, in sophisticated semiconductor devices, typically conventional gate dielectrics, such as silicon oxide-based materials, are replaced, at least partially, by so-called high-k dielectric materials, i.e., dielectric materials having a dielectric constant of 10.0 and higher, in order to increase the capacitive coupling between the gate electrode and the channel region while at the same time not unduly increasing the overall leakage currents. Upon introducing sophisticated high-k dielectric materials, typically the work function adjustment may require the incorporation of appropriate work function metal species, which may also typically be combined with the incorporation of a highly conductive electrode metal. Since the patterning of a corresponding complex gate electrode stack is very difficult, sophisticated process strategies have been developed in which a conventional gate electrode structure is formed and preserved until the basic transistor structure is completed and, in a later manufacturing stage, the placeholder materials, i.e., the polysilicon material, is removed and replaced by the desired sophisticated material system. Consequently, on the basis of any such sophisticated gate electrode structures, a further reduction of feature sizes of planar and three-dimensional transistors is possible. It turns out, however, that in particular the contacting of transistors of reduced lateral dimensions becomes increasingly difficult, for instance when the pitches between closely spaced neighboring gate electrode structures reach a range of 100 nm and significantly less. In this case, typical contact regimes, i.e., forming an interlayer dielectric material between and above the gate electrode structures, planarizing the material system and performing a complex contact patterning process so as to form openings that connect to the drain and source regions on the one side and to the gate electrode structures on the other side, may no longer be compatible with currently available lithography and patterning techniques.

Hence, "self-aligned" contact strategies have been developed in which a conductive contact material may be provided in a self-aligned manner with respect to the transistor length direction by, for instance, forming an opening in the interlayer dielectric material by a removal process that is selective with respect to the gate electrode structures. Thereafter, any appropriate conductive material may be deposited and planarized, thereby forming self-aligned contact elements that connect to the drain and source regions.

In sophisticated process strategies, a self-aligned contact regime may be combined with a replacement gate approach, wherein the actual replacement of the placeholder material may be performed after providing the self-aligned contact elements. Although this approach is very promising for further reducing the overall dimensions of planar transistors, it turns out, however, that a corresponding strategy may not be compatible with the formation of FinFETs, even if sophisticated process strategies may be applied as described above.

In view of the situation described above, the present disclosure relates to manufacturing techniques and semiconductor devices in which three-dimensional transistors or FinFETs may be provided with superior transistor characteristics, in particular to parasitic capacitance, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which a three-dimensional transistor, which may also be referred to as a multiple gate transistor or a FinFET, may be provided on the basis of a replacement gate approach, wherein the semiconductor fins may be provided in an early manufacturing stage, while the adjustment of the electrically effective height thereof may be accomplished through a gate opening formed during the replacement gate technique. To this end, the semiconductor fins may be formed in a semiconductor region by using shallow trench isolation techniques, wherein, if required, any other active regions of planar transistors may also be formed. In this manner, a substantially planar surface topography is obtained for the further processing of the device, thereby enabling the application of "two-dimensional" process techniques for forming the FinFET transistor.

In some illustrative embodiments disclosed herein, the height adjustment of the semiconductor fin through the gate opening during the replacement gate strategy is accomplished after the provision of self-aligned contact elements, thereby enabling a high degree of compatibility with highly sophisticated manufacturing strategies. In this manner, overall transistor dimensions may be reduced, while nevertheless having a reliable contacting of the drain and source areas due to the presence of the self-aligned contact elements.

One illustrative method disclosed herein comprises forming a plurality of isolation regions in a semiconductor region of a semiconductor device, wherein the plurality of isolation regions laterally delineates a plurality of fins in the semiconductor region. The method further comprises forming a placeholder gate electrode structure above the semiconductor region so as to cover a central portion of each of the plurality of isolation regions and fins. Additionally, the method comprises forming drain and source regions in each of the plurality of fins in the presence of the placeholder gate electrode structure. Moreover, the placeholder material is removed so as to expose the central portions of the plurality of isolation regions and fins. The method further comprises forming a recess selectively in the central portions of the plurality of isolation regions so as to adjust an electrically effective height of the central portions of the fins. Additionally, a gate dielectric material and an electrode material are formed in the recesses and above the central portions of the fins.

A further illustrative method disclosed herein relates to forming a semiconductor device. The method comprises forming a gate opening in a placeholder gate electrode structure that is formed above a central portion of a plurality of fins, which in turn are formed in a semiconductor region and which are laterally separated by isolation regions. The method further comprises forming a cavity in a central portion of each of the isolation regions through the gate opening so as to adjust an electrically effective height of the plurality of fins. Additionally, the method comprises forming a gate dielectric material and an electrode material in the cavities and the gate opening.

One illustrative semiconductor device disclosed herein comprises a semiconductor region comprising a plurality of fins that are separated by isolation regions, wherein each of the isolation regions has a recessed central isolation portion. The semiconductor device further comprises a high-k metal gate electrode structure formed above a central portion of the plurality of fins and above the recessed central isolation portions. Furthermore, a drain region is formed in each of the plurality of fins so as to connect to the central portion and a source region is formed in each of the plurality of fins so as to connect to the central portion. Moreover, a first self-aligned contact element is formed above each of the drain regions and above the isolation regions. Additionally, a second self-aligned contact element is formed above each of the source regions and above the isolation regions.

BRIEF DESCRIPTION OF THE DRAWINGS

The disclosure may be understood by reference to the following description taken in conjunction with the accompanying drawings, in which like reference numerals identify like elements, and in which:

FIGS. 2e-2i schematically illustrate cross-sectional views of the semiconductor device during various manufacturing stages in forming drain and source regions of planar and three-dimensional transistors, according to illustrative embodiments;

FIGS. 2l and 2m schematically illustrate top views of the semiconductor device in still further advanced manufacturing stages when adjusting the electrically effective height of the semiconductor fins and providing sophisticated gate electrode materials, according to illustrative embodiments; and FIGS. 2n and 2o schematically illustrate cross-sectional views of the FinFET or multiple gate transistors after completing the replacement gate process sequence, according to illustrative embodiments.

Figure 1:
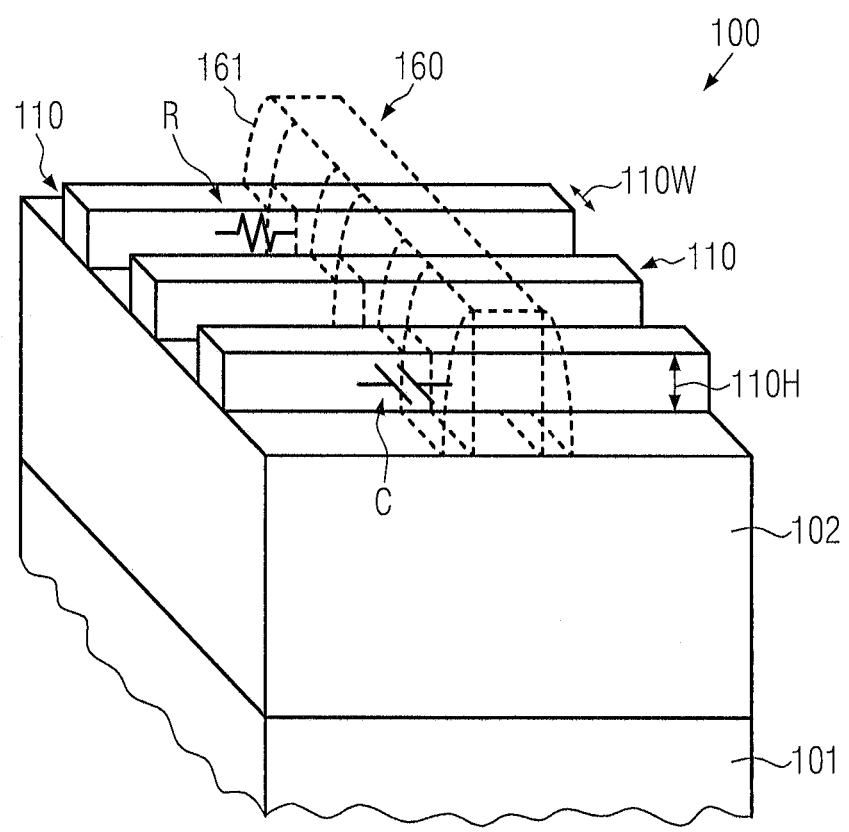
FIG. 1 schematically illustrates a perspective view of a conventional SOI-based FinFET transistor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and semiconductor devices in which multiple gate transistors, which may also be referred to as FinFETs, or generally any non-planar transistor configurations, may be provided in a self-aligned manner, i.e., self-aligned with respect to the gate electrode structures, by forming the semiconductor fins in an early manufacturing stage while nevertheless providing a planar surface topography, whereas the adjustment of the electrically effective height of the semiconductor fins, i.e., of the central portions thereof, may be accomplished in a late manufacturing stage, i.e., upon forming a replacement gate electrode structure. Consequently, the basic transistor characteristics, such as forming the drain and source regions in accordance with overall device requirements, for instance in terms of incorporating appropriate semiconductor alloys, incorporating strain-inducing mechanisms and the like, may be achieved by using "two-dimensional" transistor manufacturing strategies, thereby enabling the concurrent fabrication of planar transistors. Hence, well-established circuit layouts regarding less critical circuit portions formed on the basis of planar transistors may be efficiently re-used in sophisticated semiconductor devices, while any performance critical circuits may be formed on the basis of the three-dimensional transistors. By forming the semiconductor fins on the basis of STI techniques, the resulting fins may be considered as narrow active regions of planar transistors, which are appropriately separated by corresponding fin isolation regions so that desired compatibility with two-dimensional manufacturing techniques is ensured. During the replacement gate process sequence, however, the three-dimensional transistors may be treated differently by providing an appropriate etch mask, so as to allow the controlled recessing of the fin isolation regions, thereby adjusting the effective gate height of the central portions of the semiconductor fins. Consequently, until this manufacturing phase is achieved, any desired process strategy may be applied, for instance, the incorporation of self-aligned contact elements prior to performing the replacement gate approach, thereby ensuring scalability of the overall process sequence, since the self-aligned contact regime may allow a further reduction of the overall lateral dimensions of the transistors.

Figure 2A:
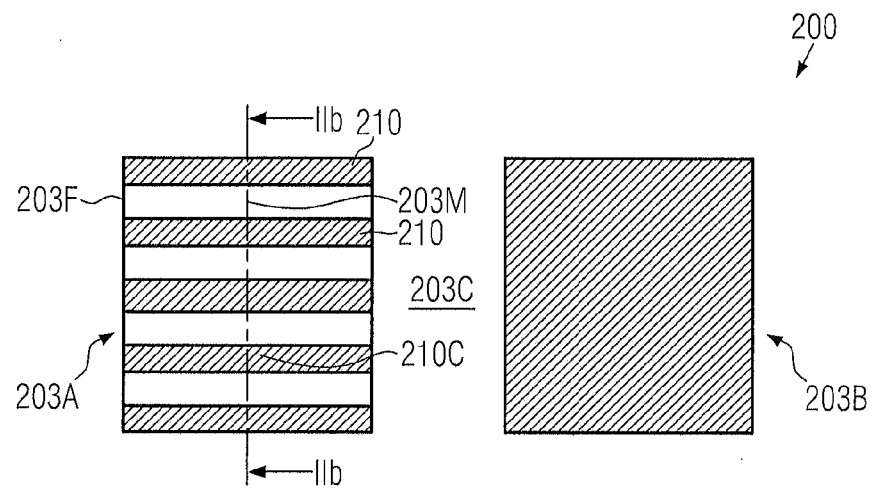
FIG. 2a schematically illustrates a top view of semiconductor regions, one of which comprises a plurality of semiconductor fins separated by isolation regions, according to illustrative embodiments.
Figure 2B:
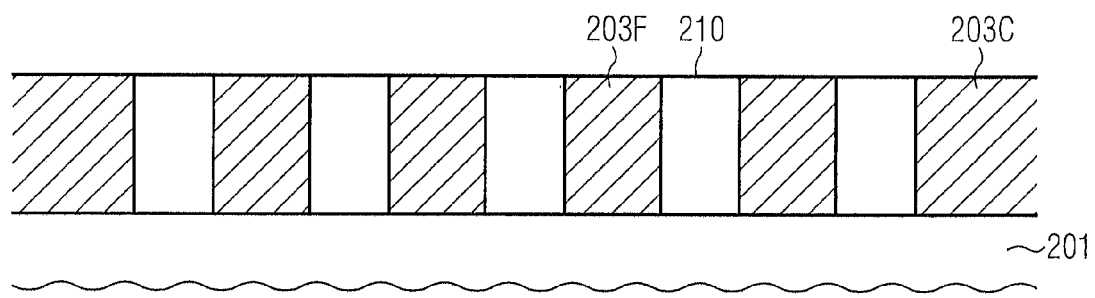
FIG. 2b schematically illustrates a cross-sectional view through a central portion of the semiconductor fins and isolation regions.
Figure 2C:
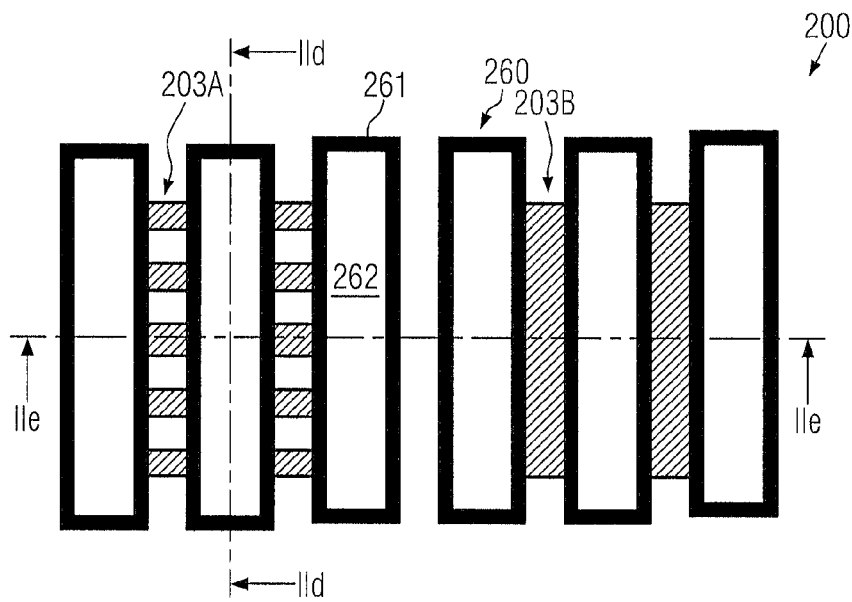
FIG. 2c schematically illustrates a top view of the semiconductor device in an advanced manufacturing stage in which placeholder gate electrode structures may be provided.
Figure 2D:
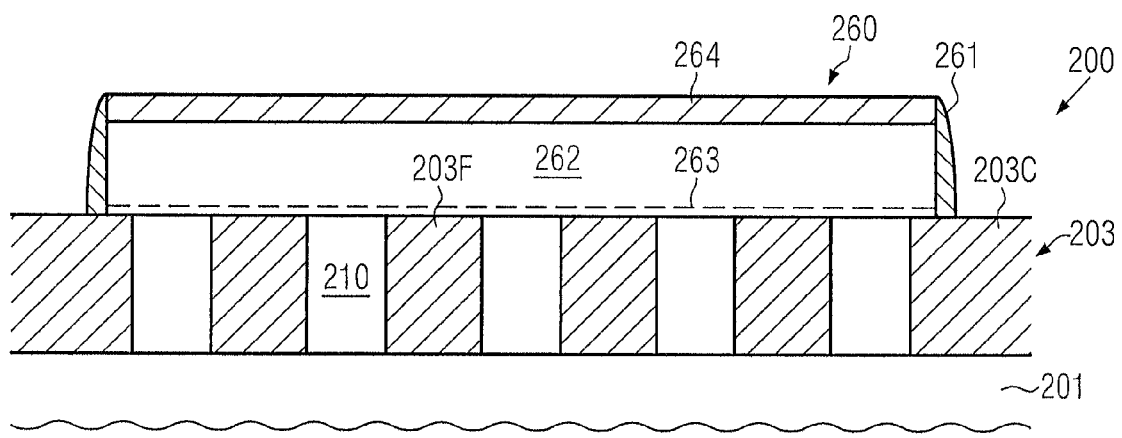
FIG. 2d schematically illustrates a cross-sectional view along a transistor width direction through a placeholder gate electrode structure, according to illustrative embodiments.
Figure 2J:
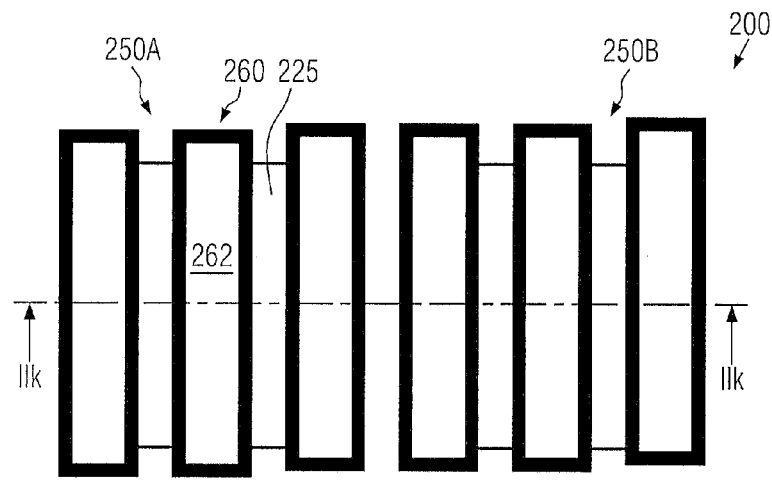
FIGS. 2j and 2k schematically illustrate a top view and a cross-sectional view, respectively, of the semiconductor device in a further advanced manufacturing stage in which self-aligned contact elements are provided, according to illustrative embodiments.
Figure 2K:
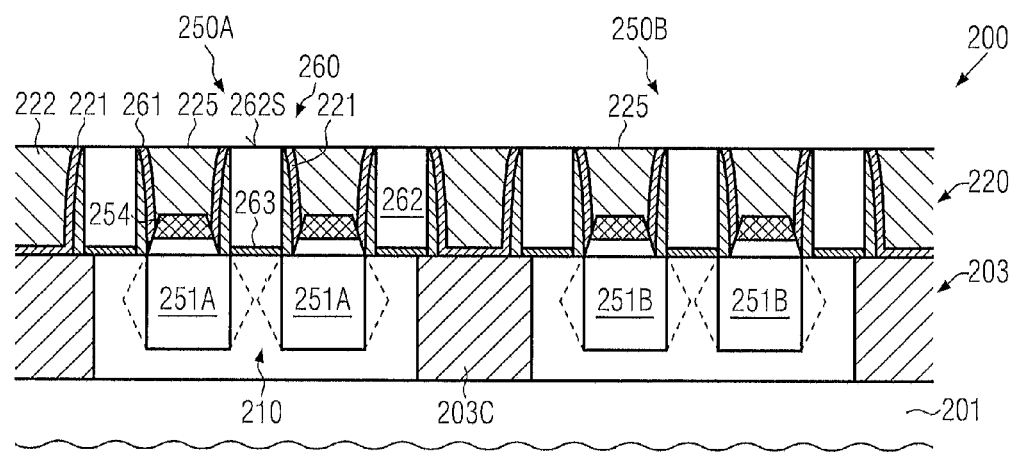
Figure 2O:
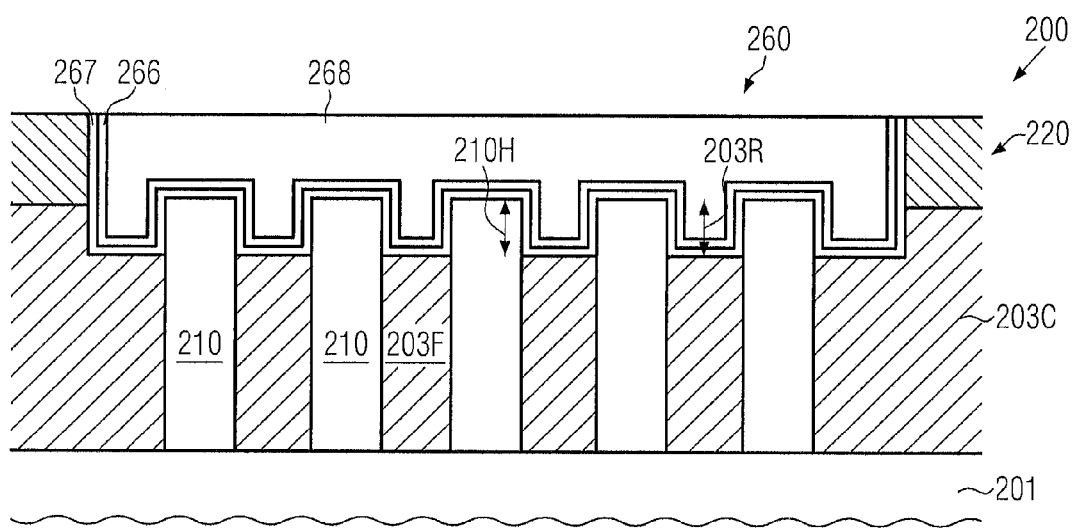

With reference to FIGS. 2a-2o, further illustrative embodiments will now be described in more detail, wherein reference may also be made to FIG. 1, if appropriate.

FIG. 2a schematically illustrates a top view of a semiconductor device 200 in an early manufacturing stage. As shown, a first semiconductor region 203A and a second semiconductor region 203B may be laterally delineated in a semiconductor layer by forming isolation structures 203C, which may be provided in the form of a shallow trench isolation. Furthermore, the semiconductor region 203A may in turn be divided into a plurality of "sub-regions," which are also referred to as semiconductor fins 210, which are laterally separated by corresponding isolation regions 203F. Thus, the fins 210 may represent elongated semiconductor regions, the lateral dimensions of which are determined by the intermediate isolation regions 203F and the overall lateral dimensions of the semiconductor region 203A, which in turn is defined in size, shape and position by the isolation region 203C. It should be appreciated that a depth of the semiconductor fins 210 is thus determined by the depth or thickness of the isolation regions 203C, 203F. For example, the base semiconductor layer may represent a bulk configuration in which an upper portion of a crystalline substrate material may act as the semiconductor base material. In this case, the semiconductor fins 210 may directly connect to the crystalline substrate material, in which are formed the trench isolation structures 203C, 203F.

FIG. 2b schematically illustrates a cross-sectional view along the line IIb of FIG. 2a, i.e., along central portions 210C, 203M of the isolation regions 203F and the semiconductor fins 210 (FIG. 2a). As illustrated, the device 200 may comprise a substrate 201, which may represent any appropriate carrier material for forming thereon or thereabove a semiconductor layer 203, which may, if a bulk configuration is considered, directly connect to a crystalline substrate material. It should be appreciated that, in the manufacturing stage shown, the semiconductor layer 203 is no longer a continuous semiconductor material but is divided into appropriate semiconductor regions, as, for instance, shown in FIG. 2a. Moreover, in other illustrative embodiments (not shown), a buried insulating material may be provided below the semiconductor layer 203, if considered appropriate for further processing and the overall device characteristics. Moreover, as shown, the semiconductor fins 210 extend through the semiconductor layer 203 and are laterally separated by the isolation regions 203F and 203C.

The semiconductor device 200 as shown in FIGS. 2a and 2b may be formed on the basis of the following process techniques. The semiconductor regions 203A, 203B may be formed on the basis of well-established shallow trench isolation (STI) techniques, i.e., by using appropriate lithography techniques, possibly in combination with a second lithography mask, so as to specifically define the lateral size, position and shape of the regions 203F. In other cases, the regions 203F may be formed in a separate patterning sequence, if considered appropriate. Hence, well-established etch and deposition techniques may be applied, followed by planarization processes and anneal techniques, if required. Hence, a substantially planar surface topography is obtained for the active regions 203A, 203B and the isolation regions 203F, 203C.

FIG. 2c schematically illustrates the semiconductor device 200 in a further advanced manufacturing stage in which a plurality of gate electrode structures 260 may be provided so as to comply with the overall device requirements. For example, a minimum pitch between the gate electrode structures 260, according to the design rules, may be implemented above the semiconductor regions 203B, 203A. The gate electrode structures 260 may represent placeholder gate electrode structures and may thus comprise a placeholder material 262, such as a polysilicon material and the like, in combination with any other materials, such as a spacer structure 261.

FIG. 2d schematically illustrates a cross-sectional view along the line IId of FIG. 2c. As shown, the gate electrode structure 260 may comprise the placeholder material 262, possibly in combination with an etch stop material 263, for instance in the form of silicon dioxide and the like, if required. Moreover, a dielectric cap layer 264 or cap layer system may be provided, for instance in the form of a silicon nitride material, silicon dioxide and the like. The device as shown in FIGS. 2c and 2d may be formed on the basis of any appropriate manufacturing strategy in which the gate electrode structures 260 may be formed so as to comply with the overall device requirements. That is, the gate length as well as the pitch of the gate electrode structures 260 is adjusted on the basis of design criteria. To this end, sophisticated lithography techniques, for instance a double exposure double patterning of the hard mask material, may be applied so as to obtain the desired lateral dimensions of the gate electrode structures 260. Moreover, the spacer structure 261 may be formed so as to comply with the further processing of the device 200. To this end, appropriate materials, such as silicon nitride, silicon dioxide and the like, may be deposited and patterned in order to form the spacer structure 261. Furthermore, during the further processing, drain and source regions may be formed in the semiconductor fins 210 and in the region 203, thereby enabling the application of any "two-dimensional" manufacturing strategies. For example, appropriate implantation techniques in combination with associated masking regimes may be applied in order to incorporate any dopant species as required for defining the overall transistor characteristics. Similarly, strain-inducing semiconductor alloys may be incorporated into at least some of the transistor elements, for instance by forming cavities in the semiconductor regions, i.e., in end portions of the semiconductor fins 210 and exposed areas of the semiconductor region 203A and by refilling these cavities with an appropriate semiconductor alloy, such as silicon/germanium, silicon/tin, silicon/germanium/tin, silicon/carbon and the like. Also, the drain and source regions may be formed on the basis of an epitaxially grown semiconductor material that is in situ doped, while in other cases the semiconductor alloy may provide superior conductivity, for instance, in the form of a silicon/phosphorous alloy and the like. Also, strain memorization techniques may be applied, if considered appropriate, for instance in N-channel transistors in order to enhance overall transistor performance. It should be appreciated that, in any process technique, the same or different process parameters may be applied, for instance by appropriately masking the two-dimensional transistors or the three-dimensional transistors, depending on the desired final transistor characteristics. For example, upon forming semiconductor materials by selective epitaxial growth techniques, certain device areas may be masked by an appropriate hard mask material. Similarly, appropriate implantation masks may be applied in order to introduce any appropriate dopant species as required.

FIG. 2e schematically illustrates the semiconductor device 200 in an advanced manufacturing stage. It should be appreciated that the cross-section is taken along the line IIe of FIG. 2c. Consequently, the transistor 250A may be represented in the form of a single semiconductor fin 210 comprising drain and source regions 251A, which thus correspond to the respective end portions of the fin 210, while a central portion 210C, covered by the central gate electrode structure 260, thus substantially corresponds to a channel region of the transistor 250A. On the other hand, the transistor 250B may comprise drain and source regions 251B, which may thus represent continuous drain and source regions along a transistor width direction, i.e., along a direction perpendicular to the drawing plane of FIG. 2e. As previously discussed, the drain and source regions 251A may be formed on the basis of a plurality of process techniques, for instance by incorporating a semiconductor alloy or by providing an epitaxially grown semiconductor material, as indicated by 252, for instance by inducing strain in the central portion 210C and/or in order to incorporate a dopant species, such as a P-type dopant species or an N-type dopant species and the like. As discussed above, corresponding manufacturing techniques may be applied differently for the transistors 250A, 250B, if considered appropriate.

FIGS. 2f and 2g schematically illustrate cross-sectional views of three-dimensional transistors in which a specifically designed process sequence may be applied so as to appropriately adjust the characteristics of the drain and source regions.

FIG. 2f schematically illustrates a cross-sectional view of the device 200 wherein, for convenience, only a central gate electrode structure 260 is shown. Furthermore, the left-hand side of FIG. 2f represents an N-channel transistor 250A, which may comprise a drain or source region 251N, for instance formed on the basis of an epitaxial grown silicon material including a high N-type dopant concentration. Furthermore, a counter-doped region or halo region, indicated as 252N, may be provided so as to adjust overall transistor characteristics. Similarly, at the right-hand side, a cross-section of the transistor 250A may represent a P-channel transistor which may, for instance, comprise a strain-inducing highly P-doped semiconductor alloy in the form of a silicon/germanium alloy in order to induce a compressive strain component in the central region or channel region 210C. For example, the drain and source region 251P of the P-channel transistor 250A may basically be defined by the size and shape of the incorporated semiconductor alloy and its in situ dopant concentration. Moreover, a corresponding counter-doped region 252P or halo region may be provided so as to comply with the overall requirements. It should be appreciated that the configuration of the drain and source regions 251N, 251P may correspond to typical two-dimensional transistor configurations and may thus also be implemented in the two-dimensional transistors, such as the transistor 250B as shown in FIG. 2e. In order to more appropriately comply with the three-dimensional configuration, additional modifications may be applied, for instance with respect to the halo regions 252N, 252P.

FIG. 2g schematically illustrates a corresponding configuration in which an additional shallow implantation may be performed, for instance by appropriately masking the two-dimensional transistors, as discussed above, thereby obtaining the modified halo regions 252N, 252P including a corresponding "wrap around" after having appropriately adjusted the effective electrical height of the semiconductor fin 210.

That is, in the manufacturing stage shown in FIG. 2g, the gate electrode structure 260 may already represent the high-k metal gate electrode structure, which may be formed on the basis of a replacement gate process sequence during which the effective height of the fin 210 may also be adjusted, as will be described later on in more detail.

FIGS. 2h and 2i schematically illustrate cross-sectional views of the transistor 250A according to further illustrative embodiments.

FIG. 2h schematically illustrates a portion of the N-channel transistor 250A on the left-hand side and a portion of the P-channel transistor 250A on the right-hand side. For example, the drain and source regions 251N of the N-channel transistor 250A may be provided in the form of a highly doped embedded semiconductor material, for instance in the form of a silicon material, a silicon/carbon material, thereby also using a desired tensile strain and the like. In other cases, a silicon/phosphorous semiconductor alloy may be incorporated by selective epitaxial growth techniques. Consequently, the drain and source regions 251N may be substantially defined by the incorporated highly doped semiconductor material or alloy. Moreover, upon forming the cavity for incorporating the in situ doped semiconductor material, a depth may be appropriately adjusted so as to substantially correspond to the effective electrical height of the semiconductor fin 210.

Similarly, drain and source regions 251P of the P-channel transistor 250A may be adjusted by appropriately forming cavities and incorporating an in situ doped semiconductor material, possibly in the form of a strain-inducing silicon/germanium alloy and the like. To this end, an appropriate etch process may be applied, wherein, if required, the two-dimensional transistors may be masked by an appropriate hard mask material or resist material and a cavity etch process may be applied commonly for the P-channel transistor and the N-channel transistor, thereby ensuring a high degree of uniformity of the resulting depth and shape and size of the cavities. Thereafter, an appropriate hard mask regime may be applied so as to sequentially form the materials 251N, 251P for the N-channel transistor and the P-channel transistor, respectively. To this end, well-established selective epitaxial growth techniques may be applied.

FIG. 2i schematically illustrates a cross-sectional view of the device in a further advanced manufacturing stage in which the gate electrode structure 260 represents the high-k metal gate electrode structure, while also the electrically effective height of the semiconductor fin 210 is adjusted, which may thus substantially correspond to the depth of the drain and source regions 251N, 251P, respectively. Consequently, in this manner, appropriate transistor characteristics may be adjusted by using basic two-dimensional manufacturing techniques and appropriately adapting the process parameters in order to comply with the three-dimensional transistor configuration. In this manner, superior transistor performance may be achieved, thereby also providing superior characteristics compared to even very sophisticated two-dimensional transistors, however, without requiring any newly developed process techniques. For example, the effect of any strain-inducing mechanisms, superior dopant profiles in the drain and source regions and the like may be determined in advance and may then be selectively applied to the three-dimensional configuration in order to appropriately adjust the transistor characteristics. In this manner, for a given lateral size of the basic active semiconductor region, superior controllability and generally superior transistor performance may be obtained by using a three-dimensional configuration, while two-dimensional transistors may be used for less critical circuit portions.

FIG. 2j schematically illustrates a top view of the semiconductor device 200 in a further advanced manufacturing stage. As shown, self-aligned contact elements 225 are provided in the transistors 250A, 250B. The self-aligned contact elements 225 may be comprised of any appropriate conductive material, which is compatible with the further processing of the device. That is, in some illustrative embodiments, the contacts 225 or at least a surface layer thereof may provide etch stop characteristics with respect to the placeholder material 262 and the material of the isolation regions 203f (FIG. 2a), which may have to be etched in a later manufacturing stage selectively with respect to the self-aligned contact elements 225. In some illustrative embodiments, the elements 225 may comprise a titanium nitride material, at least at a top surface thereof, since titanium nitride is highly resistive with respect to any oxide etch recipes, thereby enabling an efficient recessing of the isolation regions in a later manufacturing stage. Moreover, titanium nitride is also highly selective with respect to a plurality of etch chemistries for removing polysilicon material during the replacement gate approach.

FIG. 2k schematically illustrates a cross-sectional view of the semiconductor device 200 along a section as indicated in FIG. 2c by the line IId. As shown, a portion of a contact level 220 may be provided, for instance in the form of an etch stop liner 221, such as a silicon nitride material, in combination with a further dielectric material 222, such as silicon dioxide and the like. Moreover, the self-aligned contact elements may be provided laterally between the gate electrode structures 260, as already discussed above with reference to FIG. 2j. Thus, the contact elements 225 are laterally confined by the spacer structure 261 and the remaining etch stop layer 221.

Moreover, in some illustrative embodiments, appropriate contact regions 254 may be provided in the drain and source regions 251A, 251G, for instance in the form of a nickel silicide, nickel platinum silicide and the like.

The semiconductor device 200 as shown in FIG. 2k may be formed on the basis of the following processes. After completing the drain and source regions 251A, 251B and applying any high temperature processes, if required, the dielectric materials 221, 222 may be deposited, for instance by plasma enhanced chemical vapor deposition (CVD) techniques and spin-on techniques and the like, possibly in combination with additional low temperature anneal processes. Thereafter, excess material may be removed, for instance, by chemical mechanical planarization (CMP), etching and the like, wherein finally the placeholder material 262 may be exposed, i.e., a top surface 262S thereof, may be exposed. In this manufacturing stage, an appropriate mask may be provided so as to define the lateral extension of the self-aligned contact elements 225 in a direction perpendicular to the drawing plane of FIG. 2k. To this end, any appropriate mask materials, such as resist, hard mask materials and the like, may be used. Based on this etch mask, the material 222 may be etched and may thus be removed from the spaces between the gate electrode structures 260, wherein the etch process may be selective with respect to the material 262, while at the bottom of the spaces the etch stop liner 221 may be used for controlling the etch process. Thereafter, the stop liner material 221 may be opened so as to expose the drain and source regions 251A, 251B. After the removal of the etch mask, the contact regions 254 may be formed in a self-aligned manner, for instance on the basis of silicidation techniques, followed by the deposition of an appropriate conductive contact material, for instance in the form of tungsten, also in combination with titanium nitride, titanium and the like. For example, well-established tungsten-based deposition techniques may be applied if tungsten is considered appropriate for the further processing of the device 200. In some illustrative embodiments, the conductive material may be provided in the form of a titanium nitride material, which may have a higher resistance which, however, may provide superior etch stop characteristics. Furthermore, due to the relatively large area of the contact elements 225 and the reduced height, the overall contact resistivity obtained on the basis of titanium nitride is compatible with the overall device requirements. Thereafter, any excess material may be removed, for instance by CMP, thereby providing the exposed surface areas 262S.

Next, the placeholder material 262 may be removed on the basis of a selective etch recipe, such as TMAH (tetra methyl ammonium hydroxide), which may etch silicon very efficiently with high selectivity to silicon dioxide, silicon nitride, titanium nitride and the like. The etch process may be stopped on or in the dielectric material 263.

FIG. 2*l* schematically illustrates a top view of the semiconductor device 200 in a further advanced manufacturing stage. As shown, an etch mask 205 may be provided so as to cover the transistor 250B while exposing a portion of the transistor 250A and thus at least a portion of a gate opening 260O formed during the previous removal of the placeholder material. Thus, within the gate opening 260O, except for the residues of the layer 263, if still present in this phase, the central portions 210C, 203M of the semiconductor fins 210 and the isolation regions 203F, respectively, may be exposed. It should be appreciated that also end tips of these regions may be exposed by the further gate electrode structures that are partially formed above the transistor 250A, depending on the overall size of the etch mask 205. The etch mask 205 may be provided in the form of any appropriate mask material, such as resist material, possibly in combination with optical planarization materials and the like. Thereafter, an etch process may be performed in order to selectively remove material of the isolation regions 203F, for which well-established plasma assisted etch recipes are available, a high degree of selectivity may be accomplished with respect to silicon, silicon nitride and the material of the self-aligned contact elements 225, such as titanium nitride, which may be accomplished by initiating a certain degree of polymerization during the etch process. Consequently, during this etch process, the central portions 203M of the isolation regions 203F are recessed, wherein a depth of the recesses thus determines the electrically effective height of the adjacent central portions 210C of the semiconductor fins 210. Since highly controllable etch processes for removing silicon dioxide are well established, a high degree of uniformity with respect to the fin height may be achieved. Next, any etch residues may be removed, for instance on the basis of nitrogen hydride ($N_2H_2$), thereby avoiding the application of highly reactive etch chemistries, which are frequently used for moving any polymer residues after plasma assisted etch processes. In this manner, integrity of the self-aligned contact elements 225 may be preserved. Furthermore, additional cleaning processes may be applied, for instance on the basis of ozone and the like, without deteriorating any exposed materials, such as silicon, silicon dioxide, silicon nitride, titanium nitride and the like. At the same time, a chemical oxide may be formed on any exposed silicon surface areas, thereby providing a base oxide for enhancing interface characteristics prior to the deposition of a high-k dielectric material. Thereafter, the high-k dielectric material may be deposited into the respective gate openings 260O, followed by the deposition of any appropriate work function metals which may be patterned so as to form a corresponding work function metal or P-channel transistors and N-channel transistors, respectively, followed by the deposition of a highly conductive electrode metal, such as aluminum, aluminum alloys and the like. To this end, well-established replacement gate process strategies may be applied. Finally, any excess material may be removed, for instance by CMP and the like, thereby forming electrically isolated high-k metal gate electrode structures.

FIG. 2*m* schematically illustrates a top view of the transistor 250A after the replacement gate process sequence. As illustrated, the gate electrode structures 260 may comprise a high-k dielectric material 266 in combination with an appropriate work function metal 267 and a highly conductive electrode metal 268.

FIG. 2*n* schematically illustrates a cross-sectional view of the central gate electrode structure 260 wherein the cross-section is taken through one of the isolation regions 203F. As shown, during the replacement gate process sequence, the central portion 203M of isolation regions 203F have been recessed during the etch process by using the etch mask 205 (FIG. 2*l*), wherein the degree of recessing, as indicated by 203R, may thus define the electrically effective height of the semiconductor fins which are formed adjacent to the isolation region 203F in a direction perpendicular to the drawing plane of FIG. 2*n*. Thus, the gate electrode structure 260 extends into the isolation region 203F and is thus formed on the recessed portion 203M and comprises the high-k dielectric material 266, the work function metal species 267 and the highly conductive electrode metal 268. It should be appreciated that the configuration may be different for N-channel transistors and P-channel transistors, depending on the process sequence applied. That is, two or more specific layers may be formed on the dielectric layer 266, if required.

As previously discussed with reference to FIG. 1, generally the parasitic capacitance C, which typically occurs in conventional three-dimensional transistors at portions at which the merged drain and source contacts connect to the gate electrode structures in areas in which a gate-channel capacitance is not present, is substantially completely avoided in the transistor 250A since the gate electrode structure 260 connects to the isolation region 203F. Consequently, the resulting parasitic capacitance is substantially zero and thus provides superior performance characteristics compared to conventional three-dimensional transistor architectures.

FIG. 2*o* schematically illustrates a sectional view as indicated by the section IIo of FIG. 2*m*. As shown, an electrically effective height 210H of each of the semiconductor fins 210 is determined by the degree of recessing 203R of the isolation regions 203F.

Based on the transistor configuration as shown in FIGS. 2*m*-2*o*, the processing may be continued by forming appropriate interconnect structures so as to connect to the self-aligned contact elements 225 and to the gate electrode structures 260 (FIG. 2*m*), as required. To this end, an appropriate dielectric material, such as silicon dioxide, possibly in combination with silicon nitride as an etch stop material, may be applied and may be patterned so as to form corresponding openings, which may thus connect to the contacts 225 and the gate electrode structures 260. Thereafter, any appropriate material may be filled in, such as a highly conductive copper-based material in combination with appropriate barrier materials, thereby enabling a significant narrowing of the corresponding interconnect structures as may be required upon further reducing the overall lateral dimensions of the device 200. It should be appreciated that any appropriate interconnect regime may be applied, for instance a double exposure/patterning of an appropriate hard mask material.

As a result, the present disclosure provides semiconductor devices and manufacturing techniques in three-dimensional transistors or multiple gate transistors may be formed on the basis of a replacement gate approach, which, in turn, may be applied so as to enable the provision of self-aligned contact elements. To this end, the semiconductor fins may be formed in an early manufacturing stage on the basis of STI techniques, thereby providing a substantially planar surface topography, which enables the application of any desired two-dimensional process techniques. Consequently, any planar transistors may be formed concurrently with the three-dimensional transistor, while additionally any specific modifications may be applied, for instance when forming the drain and source regions, if considered appropriate. The final electrically effective height may be efficiently adjusted during the replacement gate approach and after the formation of the self-aligned contact elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of isolation regions in a semiconductor region of a semiconductor device, said plurality of isolation regions laterally delineating a plurality of fins in said semiconductor region;
   forming a placeholder gate electrode structure above said semiconductor region, said placeholder gate electrode structure covering a central portion of each of said plurality of isolation regions and fins;
   forming drain and source regions in each of said plurality of fins in the presence of said placeholder gate electrode structure;
   removing said placeholder material so as to expose said central portions of said plurality of isolation regions and fins;
   forming a recess selectively in said central portions of said plurality of isolation regions so as to adjust an electrically effective height of said central portions of said fins; and
   forming a gate dielectric material and an electrode material in said recesses and above said central portions of said fins.

2. The method of claim 1, further comprising forming contact elements laterally adjacent to said placeholder gate electrode structure prior to replacing said placeholder material so as to connect to said drain and source regions.

3. The method of claim 2, wherein forming said contact elements comprises providing a conductive contact material that has etch stop characteristics with respect to said placeholder material and material of said plurality of isolation regions.

4. The method of claim 3, wherein said conductive contact material is provided so as to have an exposed surface that comprises titanium nitride.

5. The method of claim 1, wherein forming said drain and source regions comprises depositing a doped semiconductor material in the presence of said placeholder material.

6. The method of claim 5, further comprising forming recesses in said plurality of fins and forming said doped semiconductor material at least in said recesses.

7. The method of claim 6, wherein forming said doped semiconductor material comprises forming a strain-inducing semiconductor alloy.

8. The method of claim 1, wherein forming a recess selectively in said central portions of said plurality of isolation regions comprises performing a plasma assisted etch process and removing polymer byproducts of said plasma assisted etch process by using an oxidizing chemistry so as to form an oxide layer on exposed surface areas of said central portions of said plurality of fins.

9. The method of claim 1, further comprising forming a second isolation region so as to laterally delineate a continuous semiconductor region having a lateral size that is greater than a lateral size of each of said plurality of fins, wherein the method further comprises forming a planar transistor in and above said continuous semiconductor region.

10. The method of claim 9, further comprising masking said continuous semiconductor region and said second isolation region prior to forming said recess in each of said plurality of fins.

11. A method of forming a semiconductor device, the method comprising:
   forming a gate opening in a placeholder gate electrode structure that is formed above a central portion of a plurality of fins formed in a semiconductor region and being laterally separated by isolation regions;
   forming a cavity in a central portion of each of said isolation regions through said gate opening so as to adjust an electrically effective height of said plurality of fins; and
   forming a gate dielectric material and an electrode material in said cavities and said gate opening.

12. The method of claim 11, further comprising forming a conductive contact material laterally adjacent to said placeholder gate electrode structure prior to forming said gate opening.

13. The method of claim 11, wherein forming said conductive contact material comprises providing etch stop characteristics with respect to a placeholder material and said isolation regions at least on a surface of said conductive contact material.

14. The method of claim 13, wherein said conductive contact material comprises titanium nitride at least at a surface thereof.

15. The method of claim 11, further comprising forming a drain region and a source region in each of said plurality of fins prior to forming said gate opening.

16. The method of claim 15, wherein forming drain and source regions comprises selectively depositing a doped semiconductor material.

17. The method of claim 16, wherein forming said drain and source regions comprises forming drain and source cavities in each of said plurality of fins and filling said drain and source cavities with an in situ doped semiconductor material.

* * * * *